United States Patent [19]
Wong

[11] Patent Number: 5,285,164
[45] Date of Patent: Feb. 8, 1994

[54] ELECTROMAGNETIC RADIATION MEASUREMENT APPARATUS

[75] Inventor: Larry K. Wong, Kanata, Canada

[73] Assignee: Northern Telecom Limited, Montreal, Canada

[21] Appl. No.: 921,671

[22] Filed: Jul. 30, 1992

[51] Int. Cl.⁵ .................. H01Q 17/00; G01R 31/00
[52] U.S. Cl. .................... 324/628; 324/627; 324/632; 333/81 A; 333/81 R
[58] Field of Search .......... 343/703; 333/81 A, 81 R; 324/627, 628, 632

[56] References Cited

U.S. PATENT DOCUMENTS

| | | | |
|---|---|---|---|
| 4,004,227 | 1/1977 | Ikrath | 343/703 |
| 4,837,581 | 6/1989 | Hansen | 333/81 A |
| 5,039,949 | 8/1991 | Hemming | 343/703 |
| 5,053,712 | 10/1991 | Hansen | 324/627 |

*Primary Examiner*—Kenneth A. Wieder
*Assistant Examiner*—Jose M. Solis
*Attorney, Agent, or Firm*—R. J. Austin

[57] ABSTRACT

Apparatus for measuring electromagnetic radiation from an electronic component in which a transverse electromagnetic cell has a coaxial connector for receiving radiation, a septum extending from the connector to a facing wall of the apparatus, the facing wall having a flat surface and formed from ferrite particles dispersed through rigid material. The rigid material is ceramic and conveniently the facing wall is made from ceramic tiles incorporating the ferrite particles. With this wall structure, the apparatus may be of small size suitable for measuring radiation or electronic chips or connector assemblies.

9 Claims, 3 Drawing Sheets

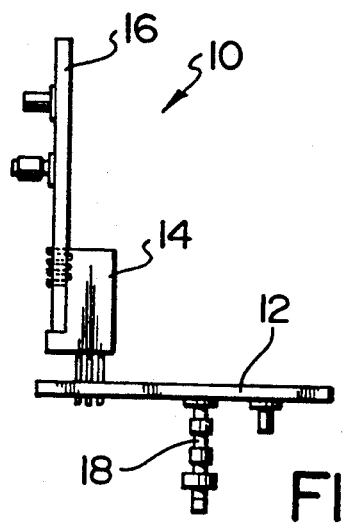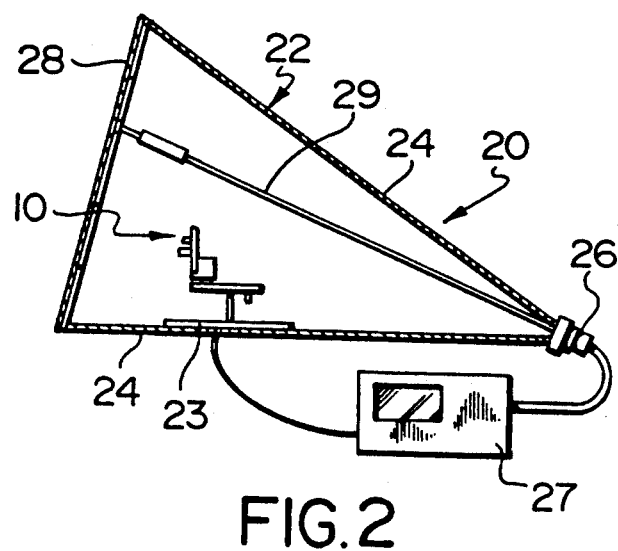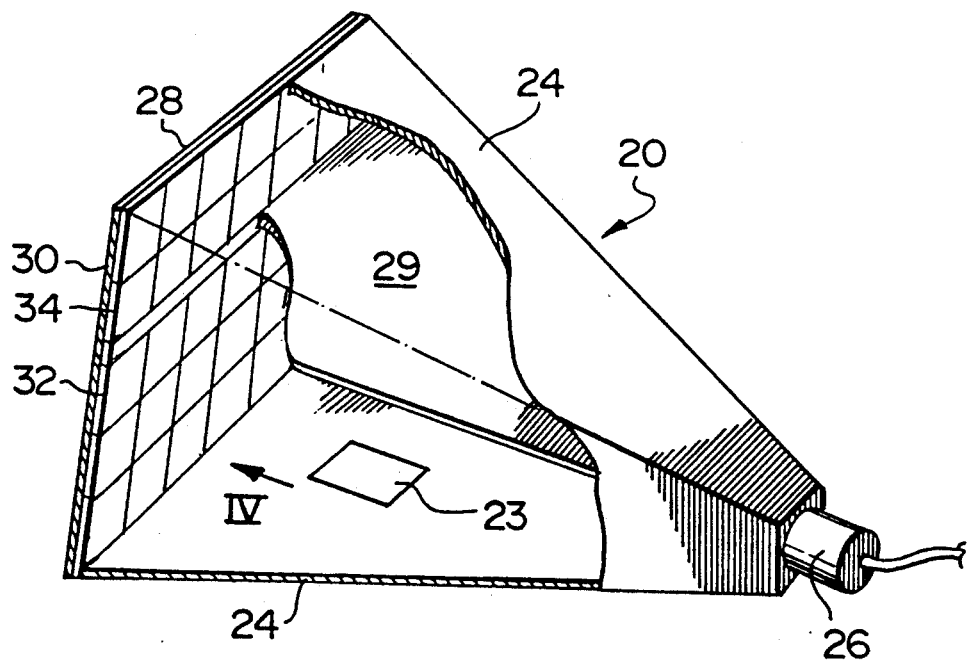

ELECTROMAGNETIC RADIATION MEASUREMENT APPARATUS

This invention relates to electromagnetic radiation measurement apparatus.

In the electronics industries, it is extremely important that every suitable measure should be taken to lessen electromagnetic emissions which may cause electromagnetic interference with other equipment. With this in mind, measurements of electromagnetic emissions at the desired wavelengths are taken from electronic equipment to determine whether emissions need to be reduced and to enable an evaluation to be made as to what steps, if any, should be taken to provide the required reduction in emissions.

For measurements purposes, apparatus has been devised comprising transverse electromagnetic cell or TEM cell, an electromagnetic radiation receiver at one end of the chamber, and signal receiving equipment exteriorly of the chamber. Within the chamber there is located a plate conductor for conducting emissions to the receiver. The TEM cell is tapered towards its receiver so that its internal surfaces are, so far as possible, directed away from the receiver whereby these surfaces will not reflect signals towards the receiver as such reflection would wrongly increase and distort the value of the emissions. The TEM cell must, however, have one wall with a surface which faces towards the receiver and to prevent reflection from such a surface it is provided by a foam wall member impregnated with carbon particles which are lossy, the foam extending as cones which taper as they extend into the chamber. The cones are mutually in contact at their base perimeters. These foam carbon impregnated cones absorb any radiation which reaches them with the cones acting at least partly as acoustic absorbers.

This structure requires the foam to be secured to a concave surface based upon the surface of a sphere centered upon the receiver.

Existing TEM cells are large and are normally used for the testing of large items of equipment, e.g. desk computers and larger. The cell size is governed partly by the size of the items of equipment to be tested, but primarily by functional limitations of the cell itself. One of these functional limitations is the cone size which is necessary to absorb radiation emissions. In practice these cones are several feet in depth, i.e. from their bases to their peaks. This fact coupled with other practical requirements results in a cell which is from ten to fifteen feet in length from the receiver to the wall which faces the receiver. A concept of cell size may be obtained from FIG. 1 of a paper entitled "A Broadband Alternative EMC Test Chamber Based On A TEM Cell Anechoic Chamber Hybrid Concept" by D. Hansen et al and given at the International Symposium on Electromagnetic Compatibility in 1989. It will be appreciated that such a cell occupies an overly large spatial volume for testing electronic equipment such as desk top computers. Because of the cell size, it has a large plate radiation conductor, commonly known as a septum, which, because of size, needs to be made from material such as aluminum. The word "septum" for a plate radiation conductor will be used through the specification and claims. However, other and much smaller items of electronic equipment (such as connector assemblies or electronic chips) emit electromagnetic radiation and while it would be advantageous to be able to measure such emissions to ascertain whether they are likely to produce interference problems which need to be addressed, TEM cells of a smaller size suitable for making such measurements are unobtainable. It would be particularly inconvenient to need to require space for housing the present large cells if they were merely required to be used for measuring radiation emissions from small electronic components. Further, small electronic components such as electronic chips may produce weak emissions and the present large TEM cells may not be sufficiently sensitive, because of their size, to measure such emissions with the required accuracy.

The present invention seeks to provide an apparatus which may be made in a small size suitable for testing electromagnetic emissions from small electronic components such as connector assemblies or electronic chips.

Accordingly, the present invention provides an apparatus for use in measuring electromagnetic radiation from an electronic component comprising a transverse electromagnetic cell having a station for location of the component to be tested, an electromagnetic radiation receiver spaced from the location station for passing signals to signal receiving equipment, the signals dependent upon electromagnetic radiation from the component, a septum electrically connected to the receiver and extending across the cell with one major surface of the septum facing towards the location station, the septum electrically connected to wall means of the chamber, said wall means remote from and directed towards the receiver, and radiation absorbent means provided by the wall means, the radiation absorbent means comprising a substantially flat surface layer facing towards the receiver, the layer containing a sufficient quantity of a lossy substance to minimize at least to a negligible extent, reflection of radiation towards the receiver. In the above apparatus according to the invention it is preferable that the lossy substance is ferromagnetic. Such a substance comprises ferrite particles provided upon the wall means.

The invention also includes apparatus for use in measuring electromagnetic radiation from an electronic component comprising a transverse electromagnetic cell having a station for location of the component to be tested, an electromagnetic radiation receiver spaced from the location station for passing signals to signal receiving equipment, the signals dependent upon electromagnetic radiation from the component, a septum electrically connected to the receiver and extending across the cell with one major surface of the septum facing towards the location station, the septum electrically connected to wall means of the cell, said wall means remote from and directed towards the receiver, and a radiation absorbent layer provided by said wall means, the radiation absorbent layer comprising a rigid material with ferrite particles dispersed throughout the rigid material to absorb electromagnetic radiation received upon said surface.

With the use of ferrite particles dispersed throughout the rigid material, it has been discovered that the TEM cell may have a length of approximately four feet from the receiver to the wall means to operate effectively for measuring the electromagnetic radiation of a component. Further, the surface of the wall means incorporating ferrite material may be planar, because the effectiveness of EM wave absorption by the ferrite does not require a concave surface to minimize reflection.

The rigid material may be provided in any suitable fashion. Conveniently the rigid material may be provided in the form of a ceramic with the ferrite particles dispersed throughout the ceramic and thus held in their dispersed positions. It has been found that the ceramic may be provided in the form of ceramic tiles laid edge-to-edge to provide a substantially continuous inner surface to the wall means. With sufficient ferrite particles in the ceramic, the tiles need be in the order of 0.20 inches thick.

One embodiment of the invention will now be described, by way of example, with reference to the accompanying drawings, in which:

FIG. 1 is a side elevational view of an electronic component, the electromagnetic radiation of which needs to be measured;

FIG. 2 is a side elevational view, in cross-section, of apparatus, shown in one position for measuring the electromagnetic radiation of the component of FIG. 1;

FIG. 3 is an isometric view, partly in section and to a larger scale, of the apparatus shown in FIG. 2;

Figure 4:
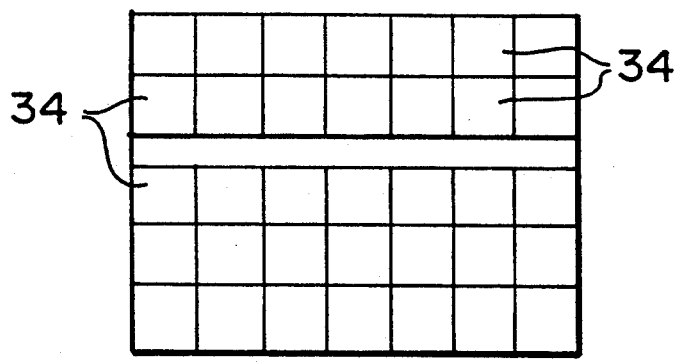
FIG. 4 is a view of an end wall of the apparatus in the direction of arrow IV in FIG. 3.

An electronic device 10 as shown in FIG. 1 is provided for electromagnetic radiation testing. As shown, the device 10 comprises a backplane 12 to which is connected a pin and box type connector 14 for connecting the backplane to a daughterboard 16. This type of device is of conventional construction and in this case the height of the device is approximately 6 cm which includes an SMA connector 18 connected to the backplane 12.

Figure 5:
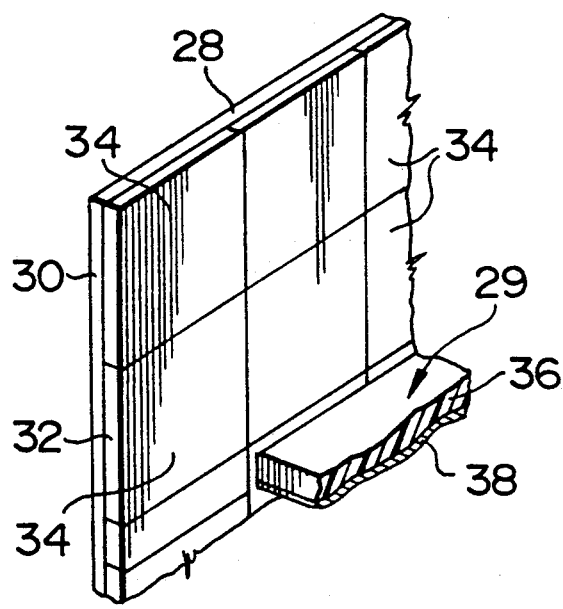
FIG. 5 is an enlarged isometric view of the end wall and to a larger scale.

Apparatus 20 according to the embodiment and suitable for measuring the electromagnetic radiation of the device 10 is shown in the other Figures. This apparatus 20 comprises a TEM cell 22 having top, bottom and side walls 24 diverging from one end of the cell at which is located an electromagnetic radiation receiver which is a coaxial connector 26. The connector 26 is connected electrically to a network analyzer 27. At the other end of the cell is disposed a wall means which comprises a wall 28 having an inner surface directed towards the connector 26. A septum 29 extends between the side walls of the cell and has a major surface facing towards a location station for the device 10. The wall 28 comprises an outside planar wall layer 30 formed from aluminum sheet and an inside planar wall layer 32 which is a radiation absorbent means comprising a plurality of ceramic tiles 34 embedded within which are ferrite particles. The tiles are laid edge-to-edge as shown in FIGS. 3, 4 and 5 so as to make the inner wall layer 32 substantially continuous. The tiles have a thickness of approximately 0.20 inches with sufficient ferrite particles in the tiles substantially to completely absorb any electromagnetic radiation emitted by the device 10 when placed within the cell 22 in its location station 23 as shown in FIGS. 2 and 3. Ceramic tiles incorporating ferrite material and suitable for this purpose are provided by Emerson Cuming under the Eccosorb (Registered Trade Mark) Designation of NZ51. These tiles have a high frequency absorption characteristic of from 100 to 5000 MHz.

It has been found that with tiles made in the above manner, that a thickness of approximately 0.20 inch for the tiles is sufficient for absorbing a substantial amount of the electromagnetic radiation from a connector assembly such as the electronic device 10 which has relatively weak emissions compared to devices the electromagnetic radiations from which are normally measured, such as desktop computers. In particular, the apparatus 20 of the embodiment is of particularly small size. It measures approximately four feet from the wall 28 to the receiver 26 and the end wall 28 is rectangular with side measurements of approximately 24"×18". The apparatus is capable of measuring accurately the weak emissions emitted by the device 10. The apparatus 20 may also be used for accurately measuring weaker emissions such as those which emanate from electronic chips.

The small size of the TEM cell which obviously makes it suitable for measuring emissions of small electronic device, is attributable at least in part to the thickness of the wall 28. The radiation is completely absorbed by the ferrite material in the ceramic tiles which measure approximately 0.20 inches as stated so that an insignificant amount of volumetric space is committed to the radiation absorbing means.

Figure 6:
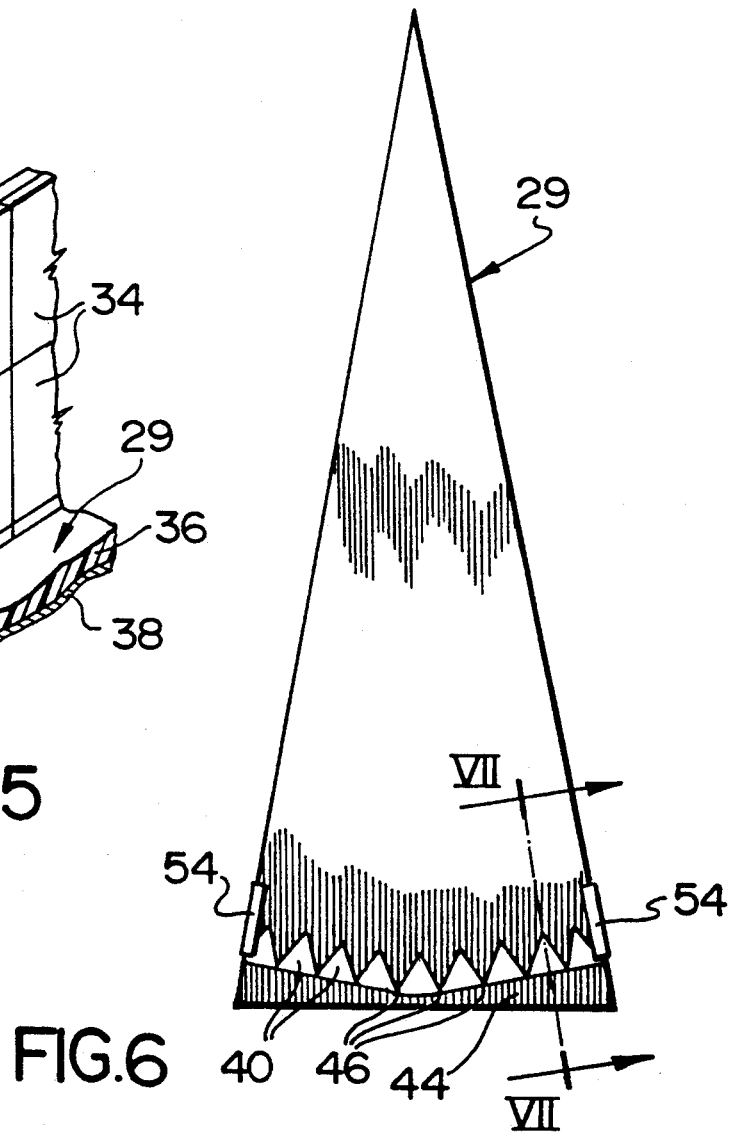
FIG. 6 is an underside plan view of a septum of the apparatus.
Figure 7:
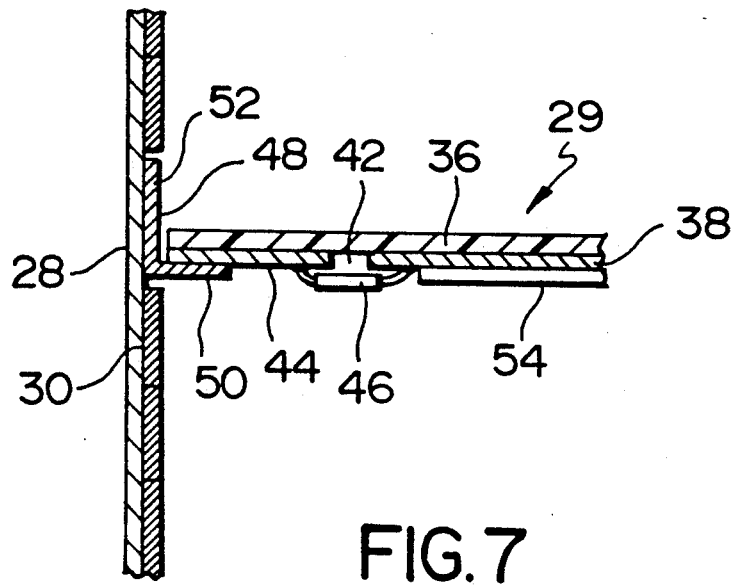
FIG. 7 is a cross-sectional view of the septum taken along line VII—VII in FIG. 6.

The septum 29 is of substantial triangular shape and because of its small size, it is possible as in this embodiment to build it like a printed circuit board. As shown by FIG. 7, the septum 29 comprises a dielectric circuit board material as a substrate layer 36 onto the underside of which is a thin conductive layer which is a copper layer 38 facing the location station 23. At the wide end of the septum, close to the wall 28, the layer of copper is etched away in a plurality of triangular areas 40 (FIG. 6) which are joined at their bases by gaps 42 (FIG. 7) to space an end region 44 of copper at the wide end from the remainder of the copper. The etching provides a multiple tapered resistor network which is connected to the copper end region 44 by a plurality (ten in this embodiment) 500 ohm resistors 46 in an array. As shown by FIG. 7, the end region 44 is electrically connected to the aluminum planar wall layer 30 by an L-shape strip 48, one leg 50 of the strip secured in electrical contact with the edge region 44 and the other leg 52 extending upwardly in contact with and secured to the wall layer 30.

Electric current in the septum has a flow which is concentrated along the long edge regions of the copper layer 38. To minimize reflection possibilities from this flow, ferrite material is placed in contact with each edge region. This ferrite material is provided with ceramic material to form a tile 54 approximately 4" in length along each long edge region of the layer 38 adjacent a resistor 46 at an end of the array of resistors. Each tile in this embodiment extends for approximately 1" across the copper layer surface (FIG. 6) and is approximately 0.20" thick.

The thickness of the tiles 34 may vary dependent upon the density of the ferrite particles within the ceramic material. Thus, if the ferrite particles are dispersed less densely throughout the ceramic, then the tiles may be required to be thicker than those described in the embodiment. However the density of the ferrite materials may be changed as required without the thickness dimension of the tiles drastically changing from that described above. Also tiles with different quantities of ferrite may be blended together to widen absorption frequency range for electromagnetic radiation. In particular, a mixture of Eccosorb Designation tiles NZ31 and NZ41 provides an overall range from 25 to 3000 MHz. Hence, the apparatus described in the embodiment provides an efficient means of measuring electromagnetic radiation of small electronic devices. The apparatus is itself of an acceptable size for use with such small devices.

As described in the embodiment, the ferrite particles form part of ceramic tiles forming the inner layer of the wall 28. However, the ferrite particles may be added as part of the wall 28 by any suitable means. It is possible to form the inner layer of the wall by mixing the ferrite particles with hardenable material which, in flowable condition, may be sprayed or painted directly onto the aluminum outside wall layer. The thickness of the inner wall layer may be built-up gradually by successive applications of the hardenable material until the required thickness for complete absorption of the radiation has been accomplished.

Figure 8:
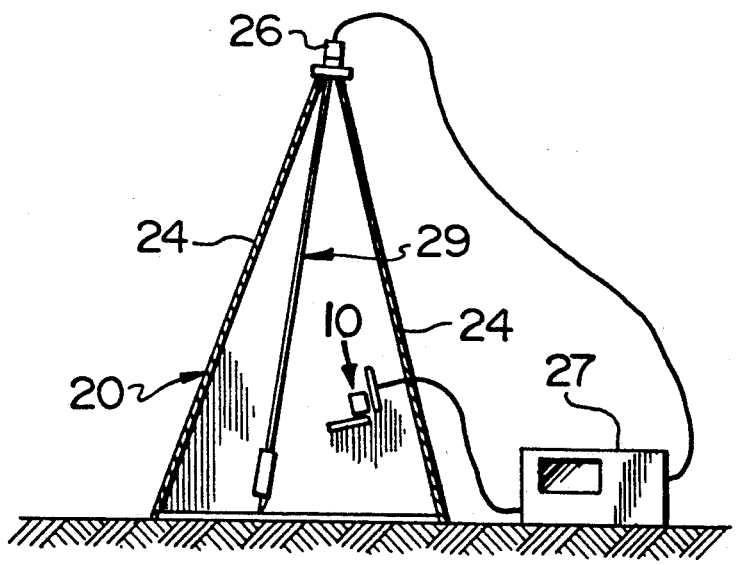
FIG. 8 is a side elevational view, in cross-section, of the apparatus and which is different from FIG. 2.

Because devices such as device 10 or electronic chips are light in weight it is possible to hang them downwardly from the wall 24 of the cell which forms the cell bottom in FIGS. 2 and 3. Thus, the cell may be oriented into the position shown in FIG. 8 with all of the walls extending upwardly from the end wall 28 which now forms the base. This orientation is made possible by the planar shape of the end wall 28 whereby the cell is stable in this position of orientation which accommodates less floor space than in the position shown in FIGS. 2 and 3.

What is claimed is:

1. Apparatus for use in measuring electromagnetic radiation from an electronic component comprising a transverse electromagnetic cell having a station for location of the component to be tested, an electromagnetic radiation receiver spaced from the location station for passing signals to signal receiving equipment, the signals dependent upon electromagnetic radiation from the component, a septum electrically connected to the receiver and extending across the cell with one major surface of the septum facing towards the location station, the septum electrically connected to wall means of the cell, said wall means remote from and directed towards the receiver, and radiation absorbent means provided by said wall means, the radiation absorbent means comprising a non-porous substantially flat surface layer facing towards the receiver, the layer containing a lossy substance to absorb electromagnetic radiation received upon the wall means.

2. Apparatus according to claim 1 wherein the lossy substance is ferromagnetic.

3. Apparatus for use in measuring electromagnetic radiation from an electronic component comprising a transverse electromagnetic cell having a station for location of the component to be tested, an electromagnetic radiation receiver spaced from the location station for passing signals to signal receiving equipment, the signals dependent upon electromagnetic radiation from the component, a septum electrically connected to the receiver and extending across the cell with one major surface of the septum facing towards the location station, the septum electrically connected to wall means of the cell, said wall means remote from and directed towards the receiver, and a radiation absorbent layer provided by said wall means, the radiation absorbent layer comprising a non-porous rigid material with ferrite particles dispersed throughout the rigid material to absorb electromagnetic radiation received upon the wall means.

4. Apparatus according to claim 3 wherein the radiation absorbent material has a substantially flat surface and is of substantially constant thickness.

5. Apparatus according to claim 4 wherein the rigid material is a ceramic which holds the particles in their dispersed positions.

6. Apparatus according to claim 3 wherein the wall means comprises a wall support layer for the radiation absorbent layer, the support layer being planar with a planar outer surface.

7. Apparatus according to claim 3 wherein the septum comprises a dielectric substrate layer and a conductive layer supported by the substrate layer, the conductive layer in an end region adjacent the wall means having parts thereof removed to provide a resistor network which also includes a plurality of resistors in parallel relationship across the end region for passage of current to the wall means.

8. Apparatus according to claim 7 wherein radiation absorbent material is located in contact with opposite edge regions of the conductive layer in a position such that the resistors are disposed closer to the wall means than the absorbent material.

9. Apparatus according to claim 8 wherein the radiation absorbent material comprises ferrite particles dispersed throughout a ceramic material.

* * * * *